United States Patent
Sumita et al.

(10) Patent No.: US 9,018,281 B2
(45) Date of Patent: Apr. 28, 2015

(54) SET OF RESIN COMPOSITIONS FOR PREPARING SYSTEM-IN-PACKAGE TYPE SEMICONDUCTOR DEVICE

(75) Inventors: Kazuaki Sumita, Annaka (JP); Kaoru Katoh, Annaka (JP); Taro Shimoda, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 225 days.

(21) Appl. No.: 13/289,619

(22) Filed: Nov. 4, 2011

(65) Prior Publication Data
US 2012/0074596 A1 Mar. 29, 2012

Related U.S. Application Data

(62) Division of application No. 11/898,615, filed on Sep. 13, 2007, now abandoned.

(30) Foreign Application Priority Data

Sep. 14, 2006 (JP) .................................. 2006-249802
Sep. 7, 2007 (JP) .................................. 2007-232555

(51) Int. Cl.
*H01L 23/28* (2006.01)
*C08L 63/00* (2006.01)
(Continued)

(52) U.S. Cl.
CPC .......... *H01L 23/3128* (2013.01); *H01L 21/563* (2013.01); *H01L 23/293* (2013.01); *H01L 25/0657* (2013.01); *H01L 2224/16225* (2013.01); *H01L 2224/32145* (2013.01); *H01L 2224/48091* (2013.01); *H01L 2224/48227* (2013.01); *H01L 2224/73203* (2013.01);
(Continued)

(58) Field of Classification Search
CPC ...... H01L 23/293; C08L 63/00; C08L 163/00
USPC ................... 523/400; 257/778, 788, 793, 795
See application file for complete search history.

(56) References Cited

U.S. PATENT DOCUMENTS 5,855,821 A * 1/1999 Chau et al. ..................... 252/514
6,166,433 A * 12/2000 Takashima et al. ............ 257/702
(Continued)

FOREIGN PATENT DOCUMENTS

JP 6-120626 A 4/1994
JP 8-8354 A 4/1994
(Continued)

*Primary Examiner* — Megan McCulley
(74) *Attorney, Agent, or Firm* — Birch, Stewart, Kolasch & Birch, LLP

(57) ABSTRACT

Set of compositions for preparing system-in-package type semiconductor device. The composition set consists of underfill composition for preparing underfill part and encapsulation resin composition for preparing resin encapsulation part. 1) A cured product of the underfill composition has a glass transition temperature, Tg, ≥100° C. and is the same with or differs from a Tg of a cured product of the encapsulation resin composition by ≤20° C. 2) Total linear expansion coefficient of the cured product of the underfill composition at a temperature not higher than (Tg−30)° C. and a linear expansion coefficient of the cured product of the encapsulation resin composition at a temperature not higher than (Tg−30)° C. is ≤42 ppm/° C. 3) A ratio of the linear expansion coefficient of the cured product of the encapsulation resin composition to the linear expansion coefficient of the cured product of the underfill composition ranges from 0.3 to 1.0.

5 Claims, 1 Drawing Sheet

(51) Int. Cl.
  *C09D 163/00* (2006.01)
  *H01L 23/31* (2006.01)
  *H01L 21/56* (2006.01)
  *H01L 23/29* (2006.01)
  *H01L 25/065* (2006.01)
  *H01L 23/00* (2006.01)

(52) U.S. Cl.
  CPC ............... *H01L 2224/73204* (2013.01); *H01L 2224/73265* (2013.01); *H01L 2225/0651* (2013.01); *H01L 2225/06517* (2013.01); *H01L 2225/06575* (2013.01); *H01L 2225/06582* (2013.01); *H01L 2225/06586* (2013.01); *H01L 2924/01012* (2013.01); *H01L 2924/01077* (2013.01); *H01L 2924/15311* (2013.01); *H01L 24/48* (2013.01); *H01L 2924/01019* (2013.01); *H01L 2924/01087* (2013.01); *H01L 2224/32225* (2013.01); *H01L 2924/10253* (2013.01)

(56) References Cited

U.S. PATENT DOCUMENTS

| | | | |
|---|---|---|---|
| 6,225,704 | B1 | 5/2001 | Sumita et al. |
| 6,723,452 | B2 | 4/2004 | Kimura et al. |
| 6,780,674 | B2 | 8/2004 | Sumita et al. |
| 7,094,844 | B2 | 8/2006 | Sumita et al. |
| 7,169,833 | B2 | 1/2007 | Sumita et al. |
| 2002/0045709 | A1* | 4/2002 | Sumita et al. .................. 525/107 |
| 2003/0050399 | A1 | 3/2003 | Kimura et al. |
| 2003/0144382 | A1* | 7/2003 | Honda et al. .................. 523/400 |
| 2003/0155664 | A1 | 8/2003 | Sumita et al. |
| 2003/0164555 | A1* | 9/2003 | Tong et al. .................... 257/787 |
| 2004/0039154 | A1 | 2/2004 | Okubo et al. |
| 2004/0054061 | A1 | 3/2004 | Sumita et al. |
| 2004/0192810 | A1 | 9/2004 | Sumita et al. |
| 2004/0227255 | A1 | 11/2004 | Sumita et al. |
| 2006/0091563 | A1* | 5/2006 | Arai et al. ..................... 257/778 |
| 2006/0208349 | A1* | 9/2006 | Fukuda et al. ................ 257/686 |

FOREIGN PATENT DOCUMENTS

| | | |
|---|---|---|
| JP | 9-176287 A | 7/1997 |
| JP | 9-176294 A | 7/1997 |
| JP | 11-256012 A | 9/1999 |
| JP | 11-274375 A | 10/1999 |
| JP | 2000-103838 A | 4/2000 |
| JP | 2003-183351 A | 7/2003 |
| JP | 2004-124089 A | 4/2004 |
| JP | 2006-16431 A | 1/2006 |
| TW | I336119 B | 1/2011 |

* cited by examiner

SET OF RESIN COMPOSITIONS FOR PREPARING SYSTEM-IN-PACKAGE TYPE SEMICONDUCTOR DEVICE

CROSS REFERENCES

The present application is a 37 C.F.R. §1.53(b) divisional of, and claims priority to, U.S. application Ser. No. 11/898,615, filed Sep. 13, 2007 now abandoned. Priority is also claimed to Japanese Patent Application No. 2006-249802 filed on Sep. 14, 2006, and Japanese Patent Application No. 2007-232555 filed on Sep. 7, 2007. The entire contents of each of these applications is hereby incorporated by reference.

FIELD OF THE INVENTION

The present invention relates to resin compositions suitable for preparing a system-in-package type semiconductor device. Specifically, the present invention relates to a set of resin compositions consisting of an underfill resin composition and encapsulating resin composition. The compositions in combination provide a semiconductor device which is strongly adhered to a substrate and has a high resistance to heat and thermal shock.

BACKGROUND OF THE INVENTION

Associated with downsizing, lightening, and functionalization of electronic devices, packaging of a semiconductor device is mainly performed by surface mounting method rather than pin insertion method. Recently, the system-in-packaging, hereinafter referred to as SIP, is widely used in which a plurality of silicon dies is packaged in one package. Particularly, a stack type SIP is used in which at least one semiconductor chip is stacked and wire bonded on another semiconductor chip.

FIG. 1 is a cross-sectional view of a semiconductor device, in which a semiconductor chip 3 is flip-chip bonded via solder bumps 2 on a surface of a substrate 1 provided with electronic circuits. The gaps between the substrate 1 and the semiconductor chip 3, i.e., spaces between the solder bumps, are filled with an underfill composition 4. FIGS. 2 and 3 show cross-sectional views of system-in-package type semiconductor devices in which one or more of semiconductor chip is placed via a die attach layer 5 on a semiconductor chip flip-chip bonded to the substrate 1. The reference numerals in the drawings refer to the following features: 1=substrate; 2=solder bumps; 3=semiconductor chip; 4=underfill part; 5=die attach part; and 6=resin encapsulation part.

SIP semiconductor devices are required to show no peeling or crack at an interface between an underfill part and a silicon chip or a substrate during a reflow process and a mounting process. In addition, the underfill part must supplement weaker adhesion of a lead-free solder than that of conventional solder.

As resin materials to avoid such peeling or crack, the Japanese Patent Application Laid-Open No. H9-176287 and H9-176294 describe resin compositions comprising a liquid epoxy resin and an alkyl-substituted aromatic amine. It is described that these compositions form cured products strongly adhered to a substrate, metal and solder resist, and give a highly reliable semiconductor package having high reflow- and thermal cycle-resistances. However, when the cured products of these resin compositions are encapsulated with a resin, they were found to crack or peel depending on the encapsulation resin used.

SUMMARY OF THE INVENTION

An object of the present invention is therefore to provide a set of an underfill composition and an encapsulation resin composition which provides semiconductor device packages resistant to heat and thermal shock.

The present invention is a set of compositions for preparing a system-in-package type semiconductor device, said system-in-package type semiconductor device comprising
  a substrate,
  a first semiconductor element flip-chip bonded to the substrate,
  an underfill part between the first semiconductor element and the substrate,
  at least one second semiconductor element placed on the first semiconductor element, and
  a resin encapsulation part covering the first semiconductor element, the underfill part and the second semiconductor element,
  characterized in that the set of compositions consists of an underfill composition for preparing the underfill part and an encapsulation resin composition for preparing the resin encapsulation part, wherein
  1) a cured product of the underfill composition has a glass transition temperature, Tg, which is 100° C. or higher and is the same with or differs from a Tg of a cured product of the encapsulation resin composition by 20° C. or smaller,
  2) a total of a linear expansion coefficient of the cured product of the underfill composition at a temperature not higher than (Tg−30)° C. and a linear expansion coefficient of the cured product of the encapsulation resin composition at a temperature not higher than (Tg−30)° C. is 42 ppm/° C. or smaller, and
  3) a ratio of the linear expansion coefficient of the cured product of the encapsulation resin composition to the linear expansion coefficient of the cured product of the underfill composition ranges from 0.3 to 1.0.

Because of the specific combination of glass transition temperatures and linear expansion coefficients, no crack or separation occurs between curing products of the compositions or the curing product and substrate when they are exposed to thermal shock such as reflow process.

DESCRIPTION OF THE PREFERRED EMBODIMENTS

Figure 1:
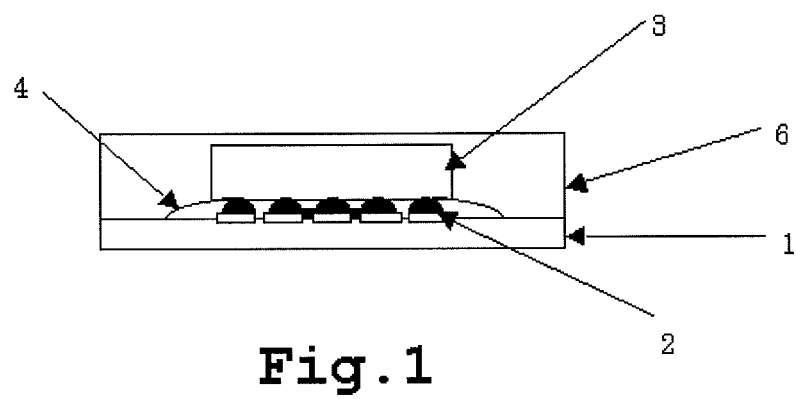
FIG. 1 is a cross-sectional view of an example of a flip-chip type semiconductor device.
Figure 2:
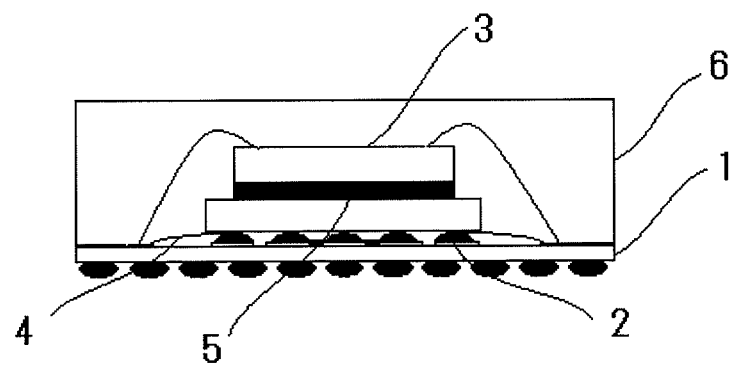
FIG. 2 is a cross-sectional view of an example of a system-in-package type semiconductor device.
Figure 3:
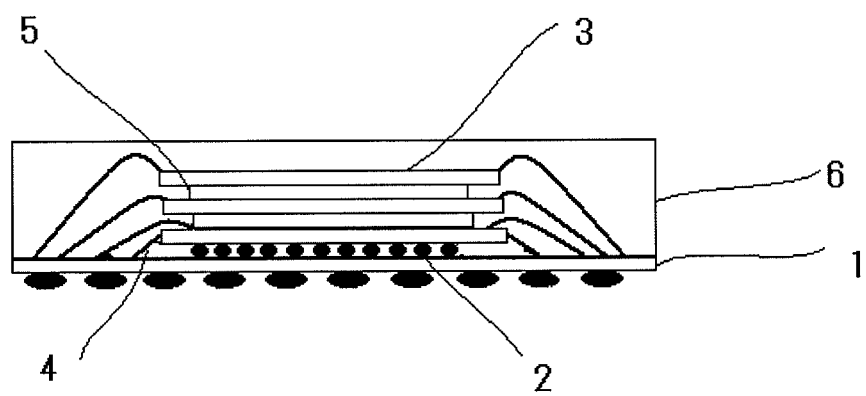
FIG. 3 is a cross-sectional vies of another example of a system-in-package type semiconductor device.

Firstly, the limitations from 1) to 3) are explained. The limitation 1) is a relationship between a glass transition temperature, hereinafter referred to as Tg, of a curing product of the underfill composition and that of a curing product of the encapsulating resin composition. The Tg can be determined by a known method such as the thermomechanical analysis (TMA) and rheological measurements. The Tg of the cured product of the underfill composition is higher than 100° C., preferably higher than 120° C. A cured product having Tg below 100° C. may be peeled off from a substrate during a reflow process due to a lower adhesion to the substrate. An upper limit of Tg is practically about 200° C. In addition, the Tg of the cured product of the underfill composition is the same with or differs from Tg of the cured product of the encapsulating resin composition by 20° C. or smaller. If the difference between the Tg's are greater than 20° C., stresses between the underfill part and encapsulation part will be so large that an interface between both parts or between the underfill or encapsulation part and a passivation layer of a substrate may peel.

The limitations 2) and 3) are relationships between linear expansion coefficients of the cured products of the both compositions. A linear expansion coefficient can be determined by the thermomechanical analysis (TMA). A linear expansion coefficient at a temperature of (Tg−30)° C. is substantially constant at any temperature not higher than (Tg−30)° C. In the present invention, it was determined from TMA data at a temperature range of from 50 to 80° C. A total of linear expansion coefficients at a temperature of (Tg−30)° C. of a cured product of the underfill composition and that of a cured product of the encapsulation resin composition is 42 ppm/° C. or smaller, preferably 40 ppm/° C. or smaller. If the total exceeds 42 ppm/° C., peeling or crack may occur at an interface between an underfill part and a resin encapsulation part or between the underfill and a passivation layer.

In addition, a ratio of the linear expansion coefficient at a temperature of (Tg−30)° C. of a cured product of the underfill composition to that of a cured product of the encapsulation resin composition ranges from 0.3 to 1.0, preferably from 0.3 to 0.9. If the ratio is outside the aforesaid range, a crack or peeling may occur between an underfill part and a resin encapsulation part.

Preferably, the underfill composition comprises (A) an epoxy resin, (B) a curing agent in such an amount that an equivalent ratio of the epoxy group in the component (A) to a functional group in the component (B) ranges from 0.7 to 1.2, said functional group being reactive with the epoxy group, and (C) an inorganic filler in an amount of from 50 to 500 parts by weight per 100 parts by weight of the component (A).

(A) Epoxy Resin

Preferred examples of the epoxy resin (A) used in the present invention include bisphenol type epoxy resins such as bisphenol F type epoxy resins and bisphenol A type epoxy resins; novolac type epoxy resins such as phenol novolac type epoxy resins and cresol novolac type epoxy resins; naphthalene ring-containing epoxy resins, biphenyl type epoxy resins, cyclopentadiene type epoxy resins, and a mixture of two or more of these epoxy resins. Among these, bisphenol A type epoxy resins and bisphenol F type epoxy resins are preferred.

The epoxy resins represented by the following formulas are also preferred.

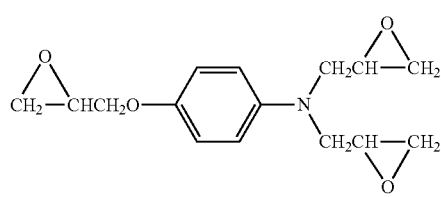

(5)

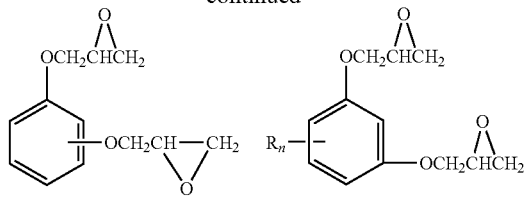

In the formula (5), R is a monovalent hydrocarbon group having 1 to 20, preferably 1 to 10, more preferably 1 to 3, carbon atoms. Examples of R include alkyl groups such as methyl, ethyl and propyl groups and alkenyl groups such as vinyl and allyl groups; n is an integer of from 1 to 4, particularly 1 or 2.

When the epoxy resin of the aforesaid formula (5) is used, its content in the whole epoxy resin (A) ranges from 25 to 100 wt %, preferably from 50 to 100 wt %, more preferably from 75 to 100 wt %. If it is contained in an amount less than the aforesaid lower limit, a viscosity of such a composition is undesirably high and heat resistance of a cured product may be low. Example of the epoxy resin of the formula (5) is the one sold under the trade name of MRGE from Nihon Kayaku Co. Ltd.

(B) Curing Agent

Examples of the curing agent (B) include amine type, polymercaptane type, imidazol type, acid anhydride type and dicyanodiamide type curing agents. Preferably, amine type and acid anhydride type curing agents are used. Preferred amine curing agent are represented by the following formulas (1) to (4),

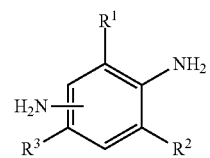
(1)

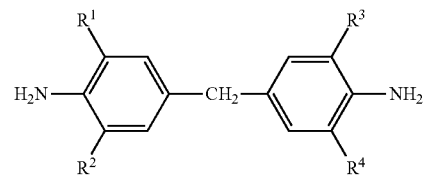
(2)

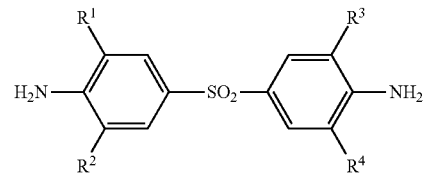
(3)

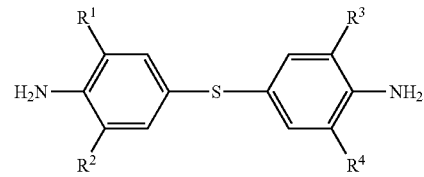
(4)

wherein $R^1$ to $R^4$ may be the same with or different from each other and are selected from the group consisting of monovalent hydrocarbon groups having 1 to 6 carbon atoms, $CH_3S-$ and $C_2H_5S-$.

Preferred examples of monovalent hydrocarbon groups include alkyl groups such as methyl, ethyl, propyl, isopropyl, butyl, isobutyl, tert-butyl, and hexyl; alkenyl groups such as vinyl, allyl, propenyl, butenyl, and hexenyl groups; phenyl group; and halogenated groups thereof such as fluoromethyl, bromoethyl, and 3,3,3-trifluoropropyl groups, among which those having 1 to 3 carbon atoms are preferred.

Aforesaid aromatic amine curing agents are mostly solid at room temperature, so that they tend to thicken the epoxy resin when they are mixed with the epoxy resin as they are. It is therefore preferred to melt-mix the amine curing agent with the epoxy resin at a temperature low enough to avoid reaction with the epoxy resin. That is, the aromatic amine curing agent is preferably melt-mixed at a temperature of from 70 to 150° C. for 1 to 2 hours with the epoxy resin. At a temperature below 70° C., the aromatic amine curing agent may not melt sufficiently, whereas at a temperature above 150° C. it tends to react with the epoxy resin to thicken the composition. A period of mixing time shorter than 1 hour may not enough to thoroughly mix the aromatic amine curing agent with epoxy resin, whereas more than 2 hours may cause reaction with the epoxy resin.

Examples of the acid anhydride curing agent include methyltetrahydrophthalic anhydride, methylhexahydrophthalic anhydride, hexahydrophthalic anhydride, methylhimic acid anhydride, pyromellitic acid dianhydride, allo-ocimene maleate, benzophenone tetracarboxylic acid anhydride, 3,3', 4,4'-biphenyltetrabisbenzophenone tetracarboxylic acid anhydride, (3,4-dicarboxyphenyl)ether dianhydride, bis(3,4-dicarboxyphenyl)methane dianhydride, 2,2-bis(3,4-dicarboxyphenyl)propane dianhydride, 3,4-dimethyl-6-(2-methyl-1-propenyl)-1,2,3,6-tetrahydrophthalic acid anhydride, 1-isopropyl-4-methyl-bicyclo[2.2.2]octo-5-ene-2,3-dicaroxylic acid anhydride and a mixture thereof. Preferred curing agents are methyltetrahydrophthalic anhydride, methylhexahydrophthalic anhydride, hexahydrophthalic anhydride, 3,4-dimethyl-6-(2-methyl-1-propenyl)-1,2,3,6-tetrahydrophthalic acid anhydride, 1-isopropyl-4-methyl-bicyclo[2.2.2]octo-5-2,3-dicaroxylic acid anhydride and a mixture thereof. These acid anhydrides are sold under the trade names of Rikacid MH700 from New Japan Chemical co., ltd., YH306 and YH307 both from Japan Epoxy Resin Co.

The curing agent (B) is contained in the composition in such an amount that an equivalent ratio of its epoxy-reactive functional group to the epoxy group of the epoxy resin (A) of from 0.7 to 1.2, preferably from 0.8 to 1.0. If it is contained less than the aforesaid lower limit, a part of the epoxy resin remains unreacted, resulting in lower glass transition temperature and smaller adhesion to a substrate. If it is contained above the aforesaid upper limit, a cured product may be so hard and brittle that it cracks in a reflow process or a heat cycle test.

(C) Inorganic Filler

As the inorganic filler, any known inorganic filler can be used. Examples of the inorganic filler include fused silica, crystalline silica, alumina, boron nitride, aluminum nitride, silicon nitride, magnesia, magnesium silicate, and aluminum. Among these, spherical fused silica is preferred because it gives a composition having a desirable low viscosity of a composition. More preferred is fused silica prepared by sol-gel method or deflagration method.

Preferably, the inorganic filler is surface treated in advance with a coupling agent such as a silane coupling agent or titanate coupling agent to strengthen adhesion between the filler and resins. Preferred coupling agents are silane coupling agents, for example, epoxy silanes such as γ-glycidoxypropyltrimethoxysilane, γ-glycidoxypropylmethyldiethoxysilane, and β-(3,4-epoxycyclohexyl)ethyl trimethoxysilane; aminosilanes such as N-β(aminoethyl)-γ-aminopropyltrimethoxysilane, γ-aminopropyltriethoxysilane, and N-phenyl-γ-aminopropyltrimethoxysilane; and mercaptosilane such as γ-mercaptosilane. An amount of the silane coupling agent and a method of surface treatment to be used are not limited to particular ones.

A particle size of the inorganic filler is preferably selected according to a gap size of a semiconductor device, i.e., a distance between a substrate and a semiconductor chip. For a typical device having a gap size ranging from 10 to 200 μm, an average particle size ranges from 0.1 to 5 μm, preferably from 0.5 to 2 μm because a underfill composition comprising such inorganic filler has a desired viscosity and gives a cured product having a desired linear expansion coefficient. A composition containing an inorganic filler having a particle size smaller than the aforesaid lower limit may have a viscosity too high to penetrate smoothly in a gap. On the other hand, an inorganic filler having a particle size larger than the aforesaid upper limit may plug the gap to cause a void in a cured product.

The inorganic filler preferably has such a particle size distribution that a fraction of particles having a particle size of one half the gap size or larger is not more than 0.1 wt %, particularly from 0 to 0.8 wt %, of the whole particles. Preferably, the inorganic filler has an average particle size, i.e., a median size ($d_{50}$), of about one-tenth of the gap size or smaller, and a maximum particle size, i.e., a particle size at 98 volume % in a cumulative particle size distribution ($d_{98}$), of one half the gap size of smaller. A particle size and its distribution can be measured by a laser diffraction method, for example. An amount of the inorganic filler having a particle size larger than one half the gap size can be determined by i) mixing the inorganic filler with pure water in a weight ratio of 1:9, ii) ultrasonicating the mixture to break up flocculants, iii) filtering the mixture with a sieve having a mesh size of one half the gap size, and iv) weighing a residue left on the sieve.

It was found that a sol-gel method and a deflagration method are most suitable for producing particles having the aforesaid particle size and its distribution. Spherical silica made by these methods has a spherical form and a controlled particle size distribution. The sol-gel method and the deflagration are well known in the art and is not explained here.

Preferably, 80 wt % or more, more preferably 90 to 100 wt %, most preferably 95 to 100 wt % of the inorganic filler is the spherical silica made by the sol-gel method or the deflagration method. If a ratio of the spherical silica is less than the aforesaid lower limit, a fluidity or spreadability of a composition may not be good.

The inorganic filler (C) is contained in the underfill composition in an amount of from 50 to 500 parts by weight, preferably from 100 to 400 parts by weight, per 100 parts by weight of the epoxy resin (A). A composition containing the inorganic filler less than the aforesaid lower limit may give a cured product having a large linear expansion coefficient, whereas a composition containing the inorganic filler larger than the aforesaid upper limit may be too viscous to smoothly penetrate in the gap.

Optional Components

The underfill composition of the present invention can contain an optional component in an amount not to adversely affect the composition. Examples of the optional components include resins to provide a cured composition with flexibility, for example, silicone-modified epoxy resin, silicone rubber, silicone oil, liquid polybutadiene rubber, and methyl methacrylate-butadiene-styrene copolymer; silane coupling agents; pigments such as carbon black; dyes, and antioxidants.

Preferably, the silicone-modified epoxy resin is a copolymer prepared by addition-reacting an epoxy resin or a phenolic resin having an alkenyl group with an organopolysiloxane represented by the following average compositional formula (6)

$$H_a R^5_b SiO_{(4-a-b)} \qquad (6)$$

wherein $R^5$ is a substituted or unsubstituted monovalent hydrocarbon group, a is a number of from 0.01 to 0.1, b is a number of from 1.8 to 2.2 with a+b ranging from 1.81 to 2.3, which has 20 to 400 silicon atoms, and 1 to 5, preferably 2 to 4, particularly 2 SiH bonds.

Preferred examples of $R^5$ include monovalent hydrocarbon group having 1 to 10, particularly 1 to 8, carbon atoms, for example, alkyl groups such as methyl, ethyl, propyl, isopropyl, butyl, isobutyl, tert-butyl, hexyl, octyl, and decyl groups; alkenyl groups such as vinyl, allyl, propenyl, butenyl and hexenyl groups; aryl groups such as phenyl, xylyl and tolyl groups; aralkyl groups such as benzyl, phenylethyl, and phenylpropyl groups, and halogenated groups thereof such as chloromethyl, bromoethyl, and trifluoropropyl groups.

Preferably, the copolymer is represented by the following formula (7).

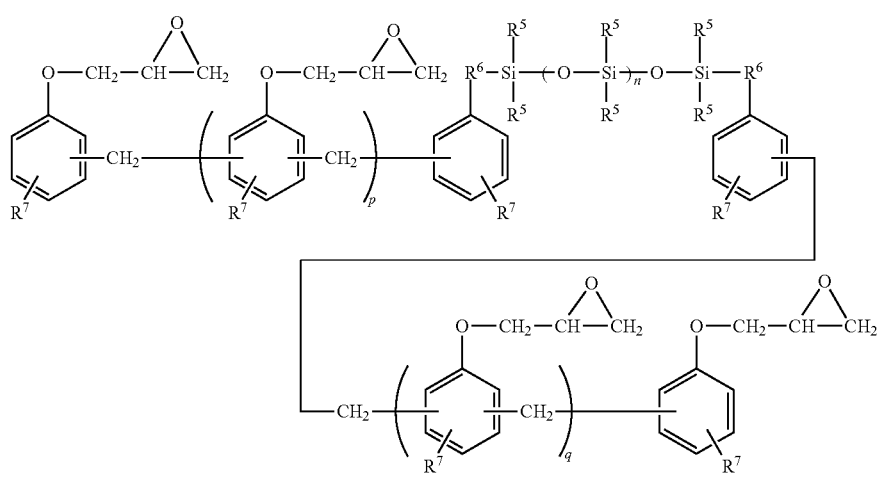

(7)

In the formula (7), $R^5$ is as defined above, $R^6$ is —$CH_2CH_2CH_2$—, —$OCH_2$—$CH(OH)$—$CH_2$—O—$CH_2CH_2CH_2$, or —O—$CH_2CH_2CH_2$—, $R^7$ is a hydrogen atom or an alkyl group having 1 to 4 carbon atoms, n is an integer of from 4 to 199, preferably from 19 to 109, p is an integer of from 1 to 10, and q is an integer of 1 to 10.

The silicone-modified epoxy resin is incorporated in the composition in such an amount that a content of the diorganosiloxane units preferably ranges from 1 to 20 parts by weight, particularly from 2 to 15 parts by weight, per 100 parts by weight of the epoxy resin (A). The silicone-modified epoxy resin can decrease stress incurred on a cured product and increase adhesion strength to a substrate. The content of the diorganosiloxane units is calculated by the following equation:

A content of diorganosiloxane units=(a molecular weight of the diorganosiloxane moiety/a molecular weight of the silicone-modified epoxy resin) X content of the silicone-modified epoxy resin Preparation of the Underfill Composition The underfill composition can by prepared by mixing the aforesaid components (A) to (C) and optional components, if desired, altogether or sequentially while heating, if necessary.

Any mixing apparatus can be used such as an automatic mortar equipped with a heater, a three-roll mill, a ball mill, and a planetary mixer.

The underfill composition preferably has a viscosity at 25° C. of from 1 to 500 Pa·s, particularly from 1 to 150 Pa·s. The underfill composition is cured in an oven preferably by heating first at a temperature of from 100 to 120° C. for 0.5 hour or longer and then at a temperature of from 150 to 170° C. for 0.5 hour or longer. If the former heating is performed shorter than 0.5 hour, a final cured product may have a void. If the latter heating is performed shorter than 0.5 hour, a final cured product may not have satisfactory mechanical properties.

Now, the encapsulation resin composition of the present invention is explained. The encapsulation resin composition comprises (a) a biphenyl aralkyl epoxy resin or triphenyl epoxy resin, (b) a biphenyl aralkyl phenolic resin or triphenyl phenolic resin in such an amount that an equivalent ratio of the epoxy group in the component (a) to the phenolic hydroxyl group in the component (b) ranges from 0.8 to 1.2, and (c) an inorganic filler in an amount of from 500 to 1,100 parts by weight per total 100 parts by weight of the components (a) and (b).

(a) A Biphenyl Aralkyl Epoxy Resin or Triphenyl Epoxy Resin

An example of the biphenyl aralkyl epoxy resin is represented by the following formula

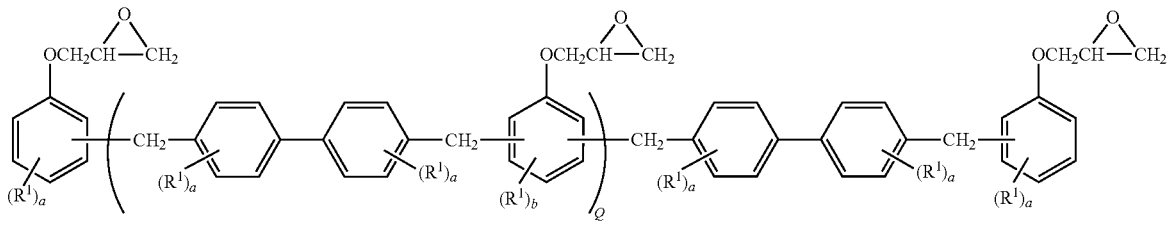

wherein $R^1$ is an alkyl group having 1 to 4 carbon atoms such as methyl, ethyl, propyl, isopropyl, butyl, isobutyl and tert-butyl groups, among which methyl group is preferred; a is an integer of from 0 to 4, b is an integer of from 0 to 3, and Q is an integer of from 0 to 10. A cured product of the biphenyl aralkyl epoxy resin is flexible with a low modulus of elasticity and is impact-resistant.

Examples of the biphenyl aralkyl epoxy resin represented by the above formula are as shown below,

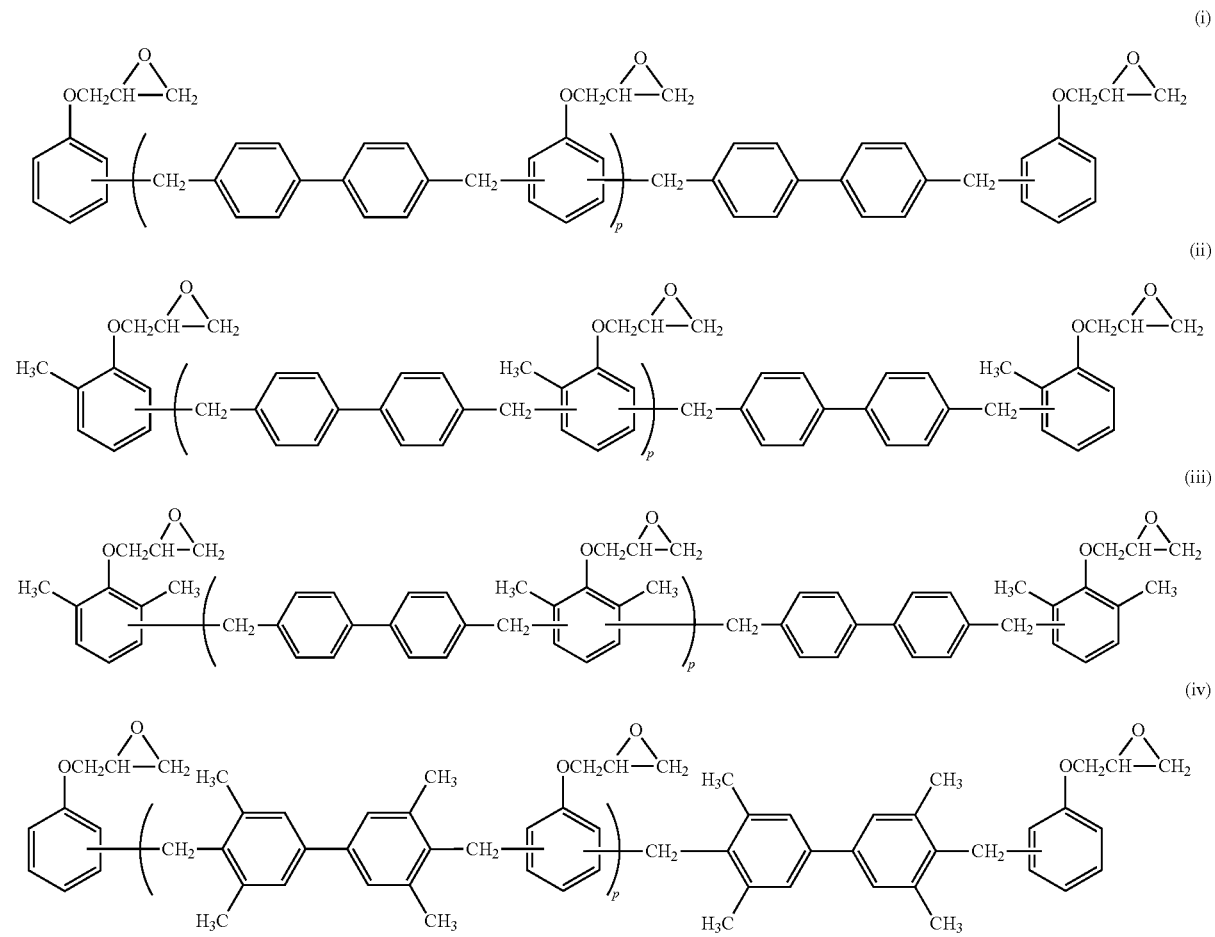

wherein p is a number of from 0.5 to 1.5.

An example of the triphenyl epoxy resin is represented by the following formula,

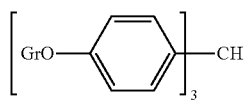

wherein Gr represents a glycidyl group. This resin gives a cured product highly resistant to heat.

The encapsulation resin composition can comprise other type of epoxy resins, for example, novolac type epoxy resins, cresol novolac type epoxy resins, triphenol alkane type epoxy resins, heterocyclic epoxy resins, naphthalene ring-containing epoxy resins, bisphenol-A type epoxy resins, bisphenol-F type epoxy resins, stilbene type epoxy resins, and a mixture thereof. Among these, those having a low melt viscosity are preferred such as bisphenol-A type epoxy resins, bisphenol-F type epoxy resins, and stilbene type epoxy resins. When the other type of epoxy resin is incorporated in the composition, the aforesaid aralkyl epoxy resin or triphenyl epoxy resin preferably dominates the component (a) in an amount of from 50 to 100 wt %, more preferably from 70 to 100 wt % of the component (a).

(b) A Biphenyl Aralkyl Phenolic Resin or Triphenyl Phenolic Resin

A preferred biphenyl aralkyl phenolic resin is represented by the following formula because the resin gives a heat- and crack-resistant cured product.

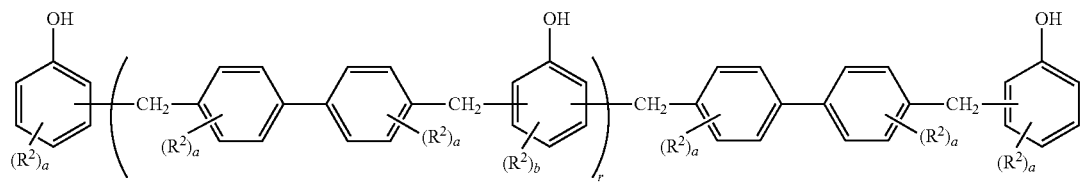

In the above formula, $R^2$ is an $C_{1-4}$ alkyl group such as methyl, ethyl, propyl, isopropyl, butyl, isobutyl and tert-butyl groups, or a phenyl group, among which methyl and phenyl groups are preferred; a is an integer of from 0 to 4; b is an integer of from 0 to 3; and Q is an integer of from 0 to 10.

Examples of the phenol resin represented by the above formula are as shown below,

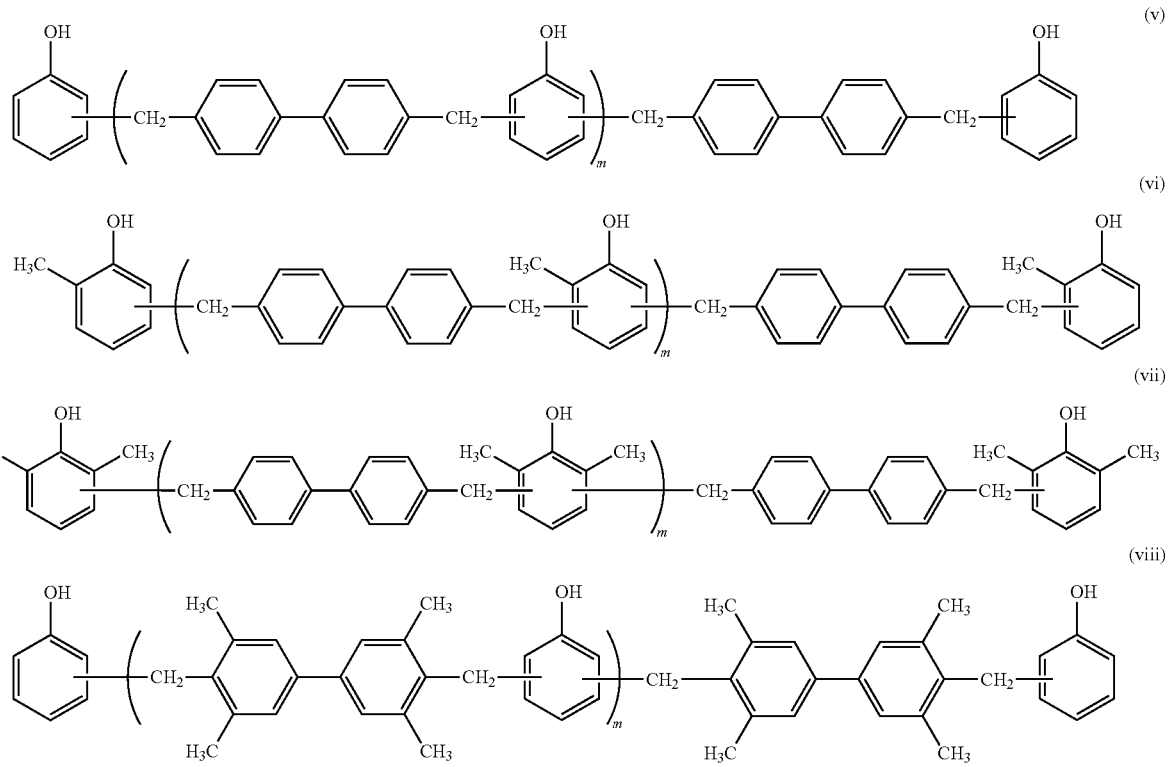

wherein m is a number of from 0.5 to 1.5 on average.

The triphenol resin is represented by the following formula,

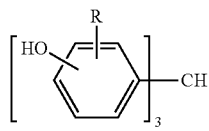

wherein R is a hydrogen atom or $C_{1-4}$ alkyl group such as methyl, ethyl, propyl, isopropyl, butyl, isobutyl, or tert-butyl group.

The triphenol type resin is resistant to heat and has a relatively low viscosity, so that it enables one to formulate a composition which forms a cured product having high glass transition temperature and contains a larger amount of filler. An example of the triphenol resin of the above formula is as shown below.

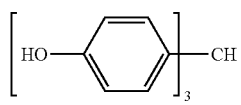

The component (b) can contain other types of phenolic resins, for example, phenol novolac type resins, naphthalene ring-containing phenolic resins, phenol aralkyl type phenolic resins, biphenyl type phenolic resins, alicyclic phenolic resins, heterocyclic phenolic resins, bisphenol-A type phenolic resins, and bisphenol-F type phenolic resins. When the other phenolic resin is contained in the composition, it is contained in an amount preferably not more than 50 wt %, more preferably not more than 70 wt %.

The component (b) is contained in the composition in such an amount that an equivalent ratio of the epoxy group in the component (a) to the phenolic hydroxyl group in the component (b) ranges from 0.8 to 1.2. A composition containing the component (a) more than the aforesaid lower upper limit may not be cured well whereas a composition containing the component (a) less than the aforesaid lower limit may form a cured product having worse moisture resistance.

(c) Inorganic Filler

As the inorganic filler (c), commonly used inorganic filler can be used. Examples of the inorganic filler include silica such as spherical fused silica, crushed fused silica, and crystalline silica, alumina, mullite, silicon nitride, aluminum nitride, boron nitride, titanium oxide, and glass fiber. Among these, silica, particularly, spherical fused silica is preferred. More preferably, the spherical fused silica has an average particle size ranging from 5 to 30 μm and a weight fraction of particles having a particle size larger than 75 μm, as measured by wet screening method, is not more than 0.2 wt % because such spherical fused silica gives a composition having good molding property and fluidity.

The component (c) is contained in the composition in an amount of from 500 to 1,100 parts by weight per total 100 parts by weight of the components (a) and (b). Less than the aforesaid lower limit of the component (c) gives a larger linear expansion coefficient of a cured composition, causing a semiconductor device to warp. A composition comprising component (c) in an amount more than the aforesaid upper limit may have a viscosity too high to be molded.

Preferably, the inorganic filler is surface treated in advance with a silane coupling agent such as an aminosilane or an epoxy silane. An amount and a method of surface treatment are not limited to particular ones.

The encapsulation resin composition can contain an optional component in an amount not to adversely affect the composition. Examples of the optional components include resins to provide a cured composition with flexibility such as thermoplastic resins, thermoplastic elastomers, synthetic organic rubbers, and silicones; release agents such as carnauba wax, colorants such as carbon black; flame retardants such as halogenated resins, antimony oxide, and molybdate; and halogen trapping agents.

The encapsulation resin composition can be prepared by (i) thoroughly mixing the components (a) to (c), and an optional component, if desired, with a mixer such as a Henschel mixer, (ii) melt-kneading the mixture with a heated roll, kneader, or an extruder, (iii) cooling the molten mixture to solidify, and (iv) pulverizing the solidified mixture. In the step (i), a silane coupling agent may be added to the mixture to promote wetting the inorganic filler. The silane coupling agent described above can be used.

Examples

The present invention will be further explained with reference to the following Examples, but shall not be limited thereto.

Preparation of Underfill Compositions

Twelve underfill compositions, UF-1 to UF-12, were prepared by kneading the components with a three-roller mill according to the formulations shown in the Table 1. The substances indicated in the Table 1 are as follows.

(A) Epoxy Resin

Epoxy resin A1: Tri-functional epoxy resin represented by the following formula, EPIKOTE 630H, ex Japan Epoxy Resin Co., Ltd.

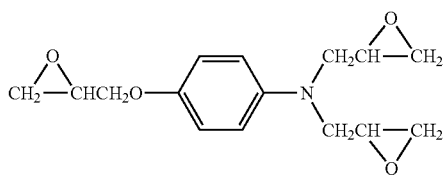

Epoxy resin A2: Bisphenol-F epoxy resin represented by the following formula, RE303S-L, ex Nihon Kayaku Co., Ltd.

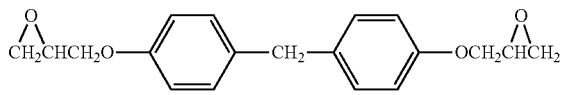

(B) Curing Agent

Curing agent B1: 3,3'-diethyl-4,4'-diaminodiphenylmethane, Kayahard AA, ex Nihon Kayaku Co., Ltd.

Curing agent B2: 3,3',5,5'-tetraethyl-4,4'-diaminodiphenylmethane, C-300S, ex Nihon Kayaku Co., Ltd.

Curing agent B3: allo-ocimene maleate, a mixture of 3,4-dimethyl-6-(2-methyl-1-propenyl)-1,2,3,6-tetrahydrophthalic acid anhydride and 1-isopropyl-4-methyl-bicyclo[2.2.2]octo-5-ene-2,3-dicarboxylic acid anhydride, YH307, ex Japan Epoxy Resin Co., Ltd.

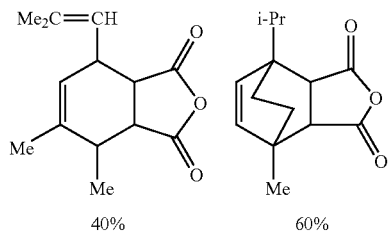

Curing agent B4: a mixture of hexahydrophthalic anhydride, Rikacid MH700, ex New Japan Chemical co., ltd.

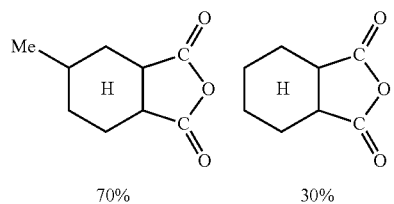

(C) Inorganic Filler

Spherical silica: Spherical silica produced by deflagration method which has an average particle size of 2.5 μm with a fraction of particles having a particle size of 25 μm or larger of 0.01 wt %, as determined by the following method.

A Method of Particle Size Analysis of Silica

A certain amount of silica was mixed with pure water with a 1:9 weight ratio, which was then ultrasonicated. The dispersion obtained was screened with a filter-1 having a mesh of 25 μm and then a filer-2 having a mesh size of 10 μm. The residues in wt % of each screening were weighed. The analysis was repeated 5 times and the results were averaged.

Additives

Silane coupling agent: γ-glycidoxypropyltrimethoxysilane, KBM403, ex Shin-Etsu Chemical Co., Ltd.

Solvent: polyethyleneglycol methyl ethyl acetate, PGMEA, having a boiling point of 146° C.

Curing catalyst: 2-ethyl-4-methyl imidazol, ex Shikoku Chemical, Co.

The compositions obtained were evaluated according to the following methods.

(1) Viscosity

Viscosity of each composition was measured according to the Japanese Industrial Standards (JIS) Z-8803 at 25° C. with an E-type viscometer. The reading was made two minutes after placing the composition in the cone.

2) Glass transition temperature (Tg), Linear expansion coefficient at a temperature of (Tg−30)° C. or less (CTE1), and Linear expansion coefficient at a temperature higher than Tg(CTE2)

A cured product was prepared by heating a composition from room temperature at a temperature increase rate of 10° C./min to a temperature of from 200 to 260° C. and keeping the temperature for a period of time of from 30 seconds to 5 minutes. The cured product obtained was cooled to room temperature from which a 5 mm×5 mm×15 mm test piece was cut out. The test piece was subjected to thermomechanical analysis (TMA) to determine Tg, CTE1 and CTE2 with a temperature increase rate of 5° C./min. When (Tg−30)° C. of the test piece was found to be lower than 100° C., CTE1 was determined from TMA data of from −30 to 0° C., and CTE2 was determined from TMA data of from 150 to 180° C. When (Tg−30)° C. of the test piece was found to be 100° C. or higher, CTE1 was determined from TMA data of from 50 to 80° C. and CTE2 was determined from TMA data of from 200 to 230° C.

(3) Void

A certain amount of a composition was penetrated in about 50 μm-gap between a 30 mm×30 mm FR-4 substrate and a flip-chip bonded silicon chip coated with a polyimide, and then heated at 165° C. for 30 minutes. The underfill thus prepared was observed for voids with a scanning acoustic microscope, C-SAM, ex SONIX K.K.

(4) Adhesion Strength

A certain amount of a composition was poured in a polytetrafluoroethylene mold in the form of a truncated cone with a bottom surface diameter of 2 mm, a top opening diameter of 5 mm, and a height of 3 mm. On the top surface of the composition a silicon chip coated with polyimide was placed, which then was heated at 150° C. for 3 hours to cure the composition. By removing the mold from the cured composition, a test piece was obtained. Initial adhesion strength was measured by pushing at a speed of 1 mm/sec a side surface of the cured composition in the form of truncated cone on the silicon chip. Adhesion strength after pressure cooker test was measured in the same manner as above on a test piece which had been kept in a pressure cooker tester at 121° C. and 2.1 atm for 336 hours. Both adhesion strengths were measured on five test pieces, respectively, and results were averaged.

(5) Fracture Toughness ($K_{1c}$)

A composition was cured at 150° C. for 3 hours. Fracture toughness at room temperature of the cured product was measured according to ASTM #D5045.

TABLE 1

| | Component, parts by weight | | UF-1 | UF-2 | UF-3 | UF-4 | UF-5 | UF-6 |
|---|---|---|---|---|---|---|---|---|
| (A) | Epoxy resin A1 | | | 20 | 29 | 58 | 44 | 44 |
| | Epoxy resin A2 | | 69 | 46 | 29 | | 19 | 19 |
| (B) | Curing agent B1 | | 14 | 16 | 20 | 20 | | |
| | Curing agent B2 | | 14 | 16 | 20 | 20 | 35 | 35 |
| | Curing agent B3 | | | | | | | |
| | Curing agent B4 | | | | | | | |
| (C) | Inorganic filler | | 150 | 150 | 150 | 150 | 150 | 250 |
| Others | Silane coupling agent | | 2.0 | 2.0 | 2.0 | 2.0 | 2.0 | 2.0 |
| | Solvent | | 3 | 3 | 3 | 3 | 3 | 3 |
| | Curing promoter | | | | | | | |
| | Equivalent ratio of (A)/(B) | | 0.80 | 0.80 | 0.80 | 0.80 | 0.80 | 0.80 |
| | Weight ratio of (C) | | 0.60 | 0.59 | 0.59 | 0.59 | 0.59 | 0.71 |
| Results | Viscosity | Pa·s@25° C. | 15.9 | 13.1 | 10.6 | 7.7 | 5.9 | 18.9 |
| | Void | | None | None | None | None | None | None |
| | Fracture toughness, $K_{1c}$ | MPam$^{1/2}$ | 2.4 | 2.2 | 2.2 | 2.2 | 2.2 | 2.2 |
| | Tg | ° C. | 95 | 110 | 125 | 160 | 137 | 136 |
| | CTE1 | ppm/° C. | 29 | 29 | 29 | 29 | 28 | 27 |
| | CTE2 | ppm/° C. | 107 | 105 | 102 | 103 | 106 | 91 |
| | Adhesion strength, MPa | Initial | 197 | 210 | 210 | 207 | 221 | 203 |
| | | After PCT336 hr | 185 | 180 | 186 | 196 | 195 | 196 |
| | Component, parts by weight | | UF-7 | UF-8 | UF-9 | UF-10 | UF-11 | UF-12 |
| (A) | Epoxy resin A1 | | 19 | 19 | 44 | 44 | 44 | 44 |
| | Epoxy resin A2 | | 19 | 19 | 19 | 19 | 19 | 19 |
| (B) | Curing agent B1 | | | | | | | |
| | Curing agent B2 | | | | 35 | 35 | 35 | 35 |
| | Curing agent B3 | | 30 | 30 | | | | |
| | Curing agent B4 | | 30 | 30 | | | | |
| (C) | Inorganic filler | | 150 | 200 | 100 | 200 | 250 | 350 |
| Others | Silane coupling agent | | 2.0 | 2.0 | 2.0 | 2.0 | 2.0 | 2.0 |
| | Solvent | | | | 3 | 3 | 3 | 3 |
| | Curing promoter | | 1 | 1 | | | | |
| | Equivalent ratio of (A)/(B) | | 1.00 | 1.00 | 0.80 | 0.80 | 0.80 | 0.80 |
| | Weight ratio of (C) | | 0.60 | 0.66 | 0.49 | 0.66 | 0.71 | 0.77 |
| Results | Viscosity | Pa·s@25° C. | 28.4 | 28.4 | 5.8 | 25.4 | 68 | 150 |
| | Void | | None | None | None | None | None | None |
| | Fracture toughness, $K_{1c}$ | MPam$^{1/2}$ | 1.3 | 1.3 | 2.3 | 2.2 | 2.3 | 2.2 |

TABLE 1-continued

| | | | | | | | |
|---|---|---|---|---|---|---|---|
| Tg | °C. | 140 | 137 | 137 | 137 | 137 | 137 |
| CTE1 | ppm/°C. | 29 | 25 | 42 | 28 | 24 | 17 |
| CTE2 | ppm/°C. | 113 | 100 | 121 | 90 | 72 | 64 |
| Adhesion strength, MPa | Initial | 185 | 186 | 234 | 234 | 229 | 231 |
| | After PCT336 hr | 96 | 83 | 200 | 196 | 184 | 189 |

Preparation of Encapsulation Resin Compositions

Six encapsulation resin compositions, EMC-1 to EMC-6, were prepared by kneading the components with a three-roller mill according to the formulations shown in the Table 2. The substances indicated in the Table 2 are as follows.

(a) Epoxy Resin

Epoxy resin a1: a biphenyl aralkyl epoxy resin of the following formula, NC-3000, ex Nihon Kayaku Co., Ltd.

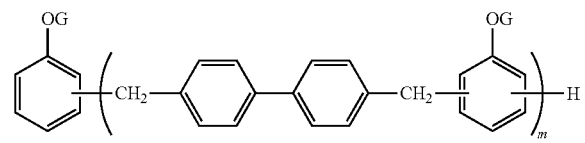

Epoxy resin a2: a tri-functional epoxy resin of the following formula, EPPN-501H, ex Nihon Kayaku Co., Ltd.

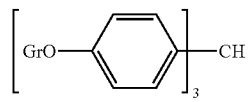

(b) Phenolic Resin

Phenolic resin b1: a tri-functional phenolic resin of the following formula, MEH-7500, Meiwa Plastic Industries, Ltd.

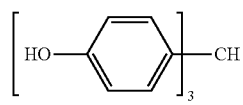

Phenolic resin b2: a biphenyl aralkyl phenolic resin of the following formula, MEH-7851, Meiwa Plastic Industries, Ltd.

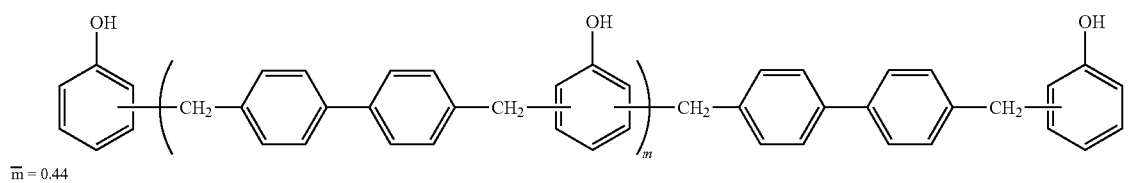

$\bar{m} = 0.44$ (c) Inorganic Filler

Spherical silica: Spherical silica produced by deflagration method which has an average particle size of 2.5 μm with a fraction of particles having a particle size of 25 μm or larger of 0.01 wt % as determined by the aforesaid method of particle size analysis.

Additives

Curing promoter: Triphenylphosphine, ex Hokko Chemical Industry Co., Ltd.

Silane coupling agent: γ-glycidoxypropyltrimethoxysilane, KBM403, ex Shin-Etsu Chemical Co., Ltd.

Carbon black: Denkablack, Denki Kagaku Kogyo Kabushiki Kaisha

The compositions obtained were evaluated according to the following methods.

(1) Spiral Flow

Using a mold according to Epoxy Molding Materials Institute (E.M.M.I) standard, a spiral flow was measured at 175° C. and at a pressure of 6.9 N/mm² for 120 seconds.

(2) Melt Viscosity

Using a Koka-shiki type flow tester equipped with a nozzle having a diameter of 1 mm, a melt viscosity was measured at 175° C. and at a pressure of 10 kgf.

(3) Glass transition temperature (Tg), Linear expansion coefficient at a temperature of (Tg−30)° C. or less (CTE1), and Linear expansion coefficient at a temperature higher than Tg(CTE2)

A cured product was obtained by heating a composition at 180° C. for 24 hours. Tg, CTE1 and CTE2 of the cured product were determined in the same manner as described above.

(4) Gel Time

A certain amount of a composition was spread on a hot plate heated at 175° C. and stirred with a spatula. A time required for the composition to be released from the hot plate was determined to be a gel time.

(5) Fracture Toughness ($K_{1c}$)

A composition was molded at 175° C. and at 6.9N/mm² for 90 seconds and post-cured at 180° C. for 4 hours. Fracture toughness at room temperature of the cured product was measured according to ASTM #D5045.

(6) Bending Strength and Modulus of Elasticity

A composition was mold at 175° C. and at 6.9N/mm² for 90 seconds and post-cured at 180° C. for 4 hours. According to JIS #K6911, bending strength and modulus of elasticity at room temperature of the cured product were measured.

(7) Specific Gravity

A composition was mold at 175° C. and at 6.9N/mm² for 90 seconds and post-cured at 180° C. for 4 hours. A specific gravity at room temperature of the cured product obtained was measured according to JIS #K6911.

TABLE 2

| Component, parts by weight | | | EMC-1 | EMC-2 | EMC-3 | EMC-4 | EMC-5 | EMC-6 |
|---|---|---|---|---|---|---|---|---|
| (a) | Epoxy resin a1 | | 55.44 | 71.40 | | 71.40 | 71.40 | 71.40 |
| | Epoxy resin a2 | | | | 69.16 | | | |
| (b) | Phenolic resin b1 | | | 28.60 | 30.84 | 28.60 | 28.60 | 28.60 |
| | Phenolic resin b2 | | 44.56 | | | | | |
| (c) | Inorganic filler | | 800.0 | 800.0 | 800.0 | 900.0 | 700.0 | 500.0 |
| Others | Curing promoter | | 1.0 | 1.0 | 1.0 | 1.0 | 1.0 | 1.0 |
| | Releasing agent | | 1.5 | 1.5 | 1.5 | 1.5 | 1.5 | 1.5 |
| | Carbon black | | 1.0 | 1.0 | 1.0 | 1.0 | 1.0 | 1.0 |
| | Silane coupling agent | | 2.0 | 2.0 | 2.0 | 2.0 | 2.0 | 2.0 |
| Results | Spiral flow | inch | 58 | 50 | 45 | 35 | 58 | 70 |
| | Viscosity | Pa·s | 6 | 8 | 9 | 13 | 5 | 2 |
| | Gel time | sec | 25 | 24 | 20 | 21 | 23 | 23 |
| | Specific gravity | g/cm$^3$ | 1.99 | 1.99 | 1.99 | 2.02 | 1.92 | 1.88 |
| | Bending strength | Kgf/mm$^2$ | 155 | 145 | 139 | 140 | 142 | 141 |
| | Modulus of elasticity | Kgf/mm$^2$ | 22200 | 21500 | 22500 | 28900 | 17580 | 15300 |
| | Fracture toughness, $K_{1c}$ | MPam$^{1/2}$ | 2.4 | 2.4 | 2.2 | 2.4 | 2.4 | 2.4 |
| | Tg | °C. | 125 | 155 | 182 | 155 | 155 | 155 |
| | CTE1 | ppm/°C. | 10 | 10 | 10 | 8 | 12 | 15 |
| | CTE2 | ppm/°C. | 38 | 38 | 37 | 32 | 43 | 50 |

Examples 1 to 22, Referential Examples 1 to 19

Using the underfill compositions and encapsulation resin compositions as indicated in Table 3, SIP type semiconductor devices were prepared according to the method described below. The devices obtained were subjected to a pressure cooker test and a thermal shock test as described below.

Preparation of a Semiconductor Device

A semiconductor device of which cross-sectional view is shown in FIG. 1 was prepared. On a 0.4 mm-thick bismaleimide-triazine (BT) resin substrate for preparing a 32×32×1.2 mm package, nine pieces of 10×10×0.3 mm silicon chip were mounted by using a spacer having a thickness of about 100 μm. An underfill composition was penetrated in a gap between each chip and the substrate and cured by heating at 120° C. for 0.5 hour and then at 165° C. for 3 hours.

The device thus obtained was encapsulated with an encapsulation resin composition by transfer-molding at 175° C. and at 6.9 N/mm$^2$. The encapsulated device was heated for 2 minutes and then at 175° C. for 5 hours to cure the encapsulation resin composition. Subsequently, the package was diced with a dicer in nine semiconductor device chips each having a size of 12 mm×12 mm with a thickness of about 3 mm.

(1) Pressure Cooker Test

Eighteen semiconductor device chips prepared as described above were kept in an environment of the level 3 of the Joint Electron Device Engineering Council (JEDEC) classification, i.e., a temperature of 30° C. and a relative humidity of 65%, for 192 hours, and then passed in an IR reflow furnace with a maximum temperature of 265° C. five times. The semiconductor device chips were inspected for peeling or cracks with a scanning acoustic microscope, C-SAM, ex SONIX K.K.

The semiconductor device chips were then kept in a pressure cooker at 121° C. and at 2.1 atm for 336 hours followed by inspection with the scanning acoustic microscope. Results are as shown in Tables 3 to 6 in which "G" indicates that no peeling or crack was detected and "NG" indicates a peeling and/or crack was detected.

(2) Thermal Shock Test

Eighteen semiconductor device chips prepared as described above were kept in an environment of a temperature of 30° C. and a relative humidity of 65% for 192 hours, and passed in an IR reflow furnace with a maximum temperature of 265° C. five times. Then, the semiconductor device chips were subjected to a thermal shock test in which one cycle consisting of cooling at −65° C. for 30 minutes and heating at 150° C. for 30 minutes. After 250, 500, 750 and 1,000 cycles, the semiconductor device chips were inspected with the scanning acoustic microscope. In Tables 3 to 6, percentages of devices in which peeling and/or crack was detected are shown. In Tables 3 to 6, "Ex." stands for Example and "R.Ex." stands for Referential Example.

TABLE 3

| | Ex. 1 | Ex. 2 | Ex. 3 | Ex. 4 | Ex. 5 | Ex. 6 |
|---|---|---|---|---|---|---|
| Underfill composition(UF) | UF-5 | UF-10 | UF-11 | UF-12 | UF-11 | UF-12 |
| Encapsulation resin composition(EMC) | EMC-2 | EMC-2 | EMC-2 | EMC-2 | EMC-4 | EMC-4 |
| CTE1 of UF, ppm/°C. | 28 | 28 | 24 | 17 | 24 | 17 |
| CTE1 of EMC, ppm/°C. | 10 | 10 | 10 | 10 | 8 | 8 |
| Total of CTE1, ppm/°C. | 38 | 38 | 34 | 27 | 32 | 25 |
| (CTE1 of EMC)/(CTE1 of UF) | 0.36 | 0.36 | 0.42 | 0.59 | 0.33 | 0.47 |
| Tg of UF, °C. | 137 | 137 | 137 | 137 | 137 | 137 |
| Tg of EMC, °C. | 155 | 155 | 155 | 155 | 155 | 155 |
| (Tg of EMC) − (Tg of UF),°C. | −18 | −18 | −18 | −18 | −18 | −18 |
| JEDEC Level 3 and IR265° C. 5 passes | G | G | G | G | G | G |
| After PCT336 hr | G | G | G | G | G | G |

TABLE 3-continued

| | | | | | | |
|---|---|---|---|---|---|---|
| Thermal shock 250 cycles, % | 0 | 0 | 0 | 0 | 0 | 0 |
| 500 cycles, % | 0 | 0 | 0 | 0 | 0 | 0 |
| 750 cycles, % | 0 | 0 | 0 | 0 | 0 | 0 |

| | Ex. 7 | Ex. 8 | Ex. 9 | Ex. 10 | Ex. 11 |
|---|---|---|---|---|---|
| Underfill composition(UF) | UF-10 | UF-11 | UF-12 | UF-11 | UF-12 |
| Encapsulation resin composition(EMC) | EMC-5 | EMC-5 | EMC-5 | EMC-6 | EMC-6 |
| CTE1 of UF, ppm/° C. | 28 | 24 | 17 | 24 | 17 |
| CTE1 of EMC, ppm/° C. | 12 | 12 | 12 | 15 | 15 |
| Total of CTE1, ppm/° C. | 40 | 36 | 29 | 39 | 32 |
| (CTE1 of EMC)/(CTE1 of UF) | 0.43 | 0.50 | 0.71 | 0.63 | 0.88 |
| Tg of UF, ° C. | 137 | 137 | 137 | 137 | 137 |
| Tg of EMC, ° C. | 155 | 155 | 155 | 155 | 155 |
| (Tg of EMC) − (Tg of UF),° C. | −18 | −18 | −18 | −18 | −18 |
| JEDEC Level 3 and IR265° C. 5 passes | G | G | G | G | G |
| After PCT336 hr | G | G | G | G | G |
| Thermal shock 250 cycles, % | 0 | 0 | 0 | 0 | 0 |
| 500 cycles, % | 0 | 0 | 0 | 0 | 0 |
| 750 cycles, % | 0 | 0 | 0 | 0 | 0 |

TABLE 4

| | Ex. 12 | Ex. 13 | Ex. 14 | Ex. 15 | Ex. 16 | Ex. 17 |
|---|---|---|---|---|---|---|
| Underfill composition(UF) | UF-2 | UF-3 | UF-5 | UF-6 | UF-7 | UF-8 |
| Encapsulation resin composition(EMC) | EMC-1 | EMC-1 | EMC-1 | EMC-1 | EMC-1 | EMC-1 |
| CTE1 of UF, ppm/° C. | 29 | 29 | 29 | 29 | 29 | 29 |
| CTE1 of EMC, ppm/° C. | 10 | 10 | 10 | 10 | 10 | 10 |
| Total of CTE1, ppm/° C. | 39 | 39 | 39 | 39 | 39 | 39 |
| (CTE1 of EMC)/(CTE1 of UF) | 0.34 | 0.34 | 0.34 | 0.34 | 0.34 | 0.34 |
| Tg of UF, ° C. | 110 | 125 | 137 | 136 | 140 | 137 |
| Tg of EMC, ° C. | 125 | 125 | 125 | 125 | 125 | 125 |
| (Tg of EMC) − (Tg of UF),° C. | −15 | 0 | 12 | 11 | 15 | 12 |
| JEDEC Level 3 and IR265° C. 5 passes | G | G | G | G | G | G |
| After PCT336 hr | G | G | G | G | G | G |
| Thermal shock 250 cycles, % | 0 | 0 | 0 | 0 | 0 | 0 |
| 500 cycles, % | 0 | 0 | 0 | 0 | 0 | 0 |
| 750 cycles, % | 0 | 0 | 0 | 0 | 0 | 0 |

| | Ex. 18 | Ex. 19 | Ex. 20 | Ex. 21 | Ex. 22 |
|---|---|---|---|---|---|
| Underfill composition(UF) | UF-4 | UF-6 | UF-7 | UF-8 | UF-5 |
| Encapsulation resin composition(EMC) | EMC-2 | EMC-2 | EMC-2 | EMC-2 | EMC-2 |
| CTE1 of UF, ppm/° C. | 29 | 29 | 29 | 29 | 29 |
| CTE1 of EMC, ppm/° C. | 10 | 10 | 10 | 10 | 10 |
| Total of CTE1, ppm/° C. | 39 | 39 | 39 | 39 | 39 |
| (CTE1 of EMC)/(CTE1 of UF) | 0.34 | 0.34 | 0.34 | 0.34 | 0.34 |

TABLE 4-continued

|  |  |  |  |  |  |
|---|---|---|---|---|---|
| Tg of UF, °C. | 160 | 136 | 140 | 137 | 137 |
| Tg of EMC, °C. | 155 | 155 | 155 | 155 | 155 |
| (Tg of EMC) − (Tg of UF),°C. | 5 | −19 | −15 | −18 | −18 |
| JEDEC Level 3 and IR265° C. 5 passes | G | G | G | G | G |
| After PCT336 hr | G | G | G | G | G |
| Thermal shock 250 cycles, % | 0 | 0 | 0 | 0 | 0 |
| 500 cycles, % | 0 | 0 | 0 | 0 | 0 |
| 750 cycles, % | 0 | 0 | 0 | 0 | 0 |

TABLE 5

|  | R. Ex. 1 | R. Ex. 2 | R. Ex. 3 | R. Ex. 4 | R. Ex. 5 |
|---|---|---|---|---|---|
| Underfill composition(UF) | UF-9 | UF-9 | UF-10 | UF-9 | UF-9 |
| Encapsulation resin composition(EMC) | EMC-2 | EMC-4 | EMC-4 | EMC-5 | EMC-6 |
| CTE1 of UF, ppm/°C. | 42 | 42 | 28 | 42 | 42 |
| CTE1 of EMC, ppm/°C. | 10 | 8 | 8 | 12 | 15 |
| Total of CTE1, ppm/°C. | 52 | 50 | 36 | 54 | 57 |
| (CTE1 of EMC)/(CTE1 of UF) | 0.24 | 0.19 | 0.29 | 0.29 | 0.36 |
| Tg of UF, °C. | 137 | 137 | 137 | 137 | 137 |
| Tg of EMC, °C. | 155 | 155 | 155 | 155 | 155 |
| (Tg of EMC) − (Tg of UF),°C. | −18 | −18 | −18 | −18 | −18 |
| JEDEC Level 3 and IR265° C. 5 passes | NG | NG | NG | NG | NG |
| After PCT336 hr | NG | NG | G | NG | NG |
| Thermal shock 250 cycles, % | 50 | 0 | 0 | 50 | 0 |
| 500 cycles, % | 100 | 0 | 0 | 100 | 0 |
| 750 cycles, % | — | 0 | 0 | — | 0 |

|  | R. Ex. 6 | R. Ex. 7 | R. Ex. 8 | R. Ex. 9 |
|---|---|---|---|---|
| Underfill composition(UF) | UF-10 | UF-1 | UF-4 | UF-1 |
| Encapsulation resin composition(EMC) | EMC-6 | EMC-1 | EMC-1 | EMC-2 |
| CTE1 of UF, ppm/°C. | 28 | 29 | 29 | 29 |
| CTE1 of EMC, ppm/°C. | 15 | 10 | 10 | 10 |
| Total of CTE1, ppm/°C. | 43 | 39 | 39 | 39 |
| (CTE1 of EMC)/(CTE1 of UF) | 0.54 | 0.34 | 0.34 | 0.34 |
| Tg of UF, °C. | 137 | 95 | 160 | 95 |
| Tg of EMC, °C. | 155 | 125 | 125 | 155 |
| (Tg of EMC) − (Tg of UF),°C. | −18 | −30 | 35 | −60 |
| JEDEC Level 3 and IR265° C. 5 passes | NG | NG | NG | NG |
| After PCT336 hr | G | NG | NG | NG |
| Thermal shock 250 cycles, % | 0 | 10 | 0 | 10 |
| 500 cycles, % | 0 | 50 | 0 | 50 |
| 750 cycles, % | 0 | 100 | 0 | 100 |

TABLE 6

|  | R. Ex. 10 | R. Ex. 11 | R. Ex. 12 | R. Ex. 13 | R. Ex. 14 |
|---|---|---|---|---|---|
| Underfill composition(UF) | UF-2 | UF-3 | UF-1 | UF-2 | UF-3 |
| Encapsulation resin composition(EMC) | EMC-2 | EMC-2 | EMC-3 | EMC-3 | EMC-3 |
| CTE1 of UF, ppm/°C. | 29 | 29 | 29 | 29 | 29 |
| CTE1 of EMC, ppm/°C. | 10 | 10 | 10 | 10 | 10 |
| Total of CTE1, ppm/°C. | 39 | 39 | 39 | 39 | 39 |
| (CTE1 of EMC)/(CTE1 of UF) | 0.34 | 0.34 | 0.34 | 0.34 | 0.34 |
| Tg of UF, °C. | 110 | 125 | 95 | 110 | 125 |
| Tg of EMC, °C. | 155 | 155 | 182 | 182 | 182 |
| (Tg of EMC) − (Tg of UF),°C. | −45 | −30 | −87 | −72 | −57 |
| JEDEC Level 3 and IR265° C. 5 passes | NG | NG | NG | NG | NG |
| After PCT336 hr | NG | NG | NG | NG | NG |
| Thermal shock 250 cycles, % | 25 | 0 | 60 | 60 | 0 |

TABLE 6-continued

| | | | | | |
|---|---|---|---|---|---|
| 500 cycles, % | 64 | 0 | 100 | 100 | 0 |
| 750 cycles, % | 100 | 0 | — | — | 0 |

| | R. Ex. 15 | R. Ex. 16 | R. Ex. 17 | R. Ex. 18 | R. Ex. 19 |
|---|---|---|---|---|---|
| Underfill composition(UF) | UF-4 | UF-5 | UF-6 | UF-7 | UF-8 |
| Encapsulation resin composition(EMC) | EMC-3 | EMC-3 | EMC-3 | EMC-3 | EMC-3 |
| CTE1 of UF, ppm/° C. | 29 | 29 | 29 | 29 | 29 |
| CTE1 of EMC, ppm/° C. | 10 | 10 | 10 | 10 | 10 |
| Total of CTE1, ppm/° C. | 39 | 39 | 39 | 39 | 39 |
| (CTE1 of EMC)/(CTE1 of UF) | 0.34 | 0.34 | 0.34 | 0.34 | 0.34 |
| Tg of UF, ° C. | 160 | 137 | 136 | 140 | 137 |
| Tg of EMC, ° C. | 182 | 182 | 182 | 182 | 182 |
| (Tg of EMC) − (Tg of UF),° C. | −22 | −45 | −46 | −42 | −45 |
| JEDEC Level 3 and IR265° C. 5 passes | NG | NG | NG | NG | NG |
| After PCT336 hr | NG | NG | NG | NG | NG |
| Thermal shock 250 cycles, % | 0 | 0 | 0 | 0 | 0 |
| 500 cycles, % | 0 | 0 | 0 | 0 | 0 |
| 750 cycles, % | 0 | 0 | 0 | 0 | 0 |

Referential Examples 10 to 22 in which differences in Tg between the cured products of the underfill and the encapsulation resin compositions were larger than 20° C. showed peeling after the pressure cooker test as shown in Tables 5 and 6. Referential Examples 1, 2, 4 and 5 in which a total of linear expansion coefficients at (Tg−30)° C. exceeded 45 ppm/° C. showed peeling after the reflow process. Referential Example 3 in which a ratio of the linear expansion coefficient of the cured encapsulation resin composition to that of the cured underfill composition was smaller than 0.3 showed peeling after the reflow process. In contrast to these, the devices in Examples 1 to 22 did not show any peeling or cracks, and were resistant to the thermal shock. The composition set of the present invention is therefore suitable for preparing a system-in-package type semiconductor device resistant to heat and thermal shock.

The invention claimed is:

1. A system-in-package semiconductor device, comprising a substrate,
a first semiconductor element flip-chip bonded to the substrate,
an underfill part between the first semiconductor element and the substrate,
at least one second semiconductor element placed on the first semiconductor element, and
a resin encapsulation part covering the whole of the first semiconductor element, the underfill part, and the second semiconductor element,
wherein the underfill part and the encapsulation part are composed of a cured products of an underfill composition for preparing the underfill part and an encapsulating resin composition for preparing the resin encapsulation part, respectively,
wherein the underfill composition comprises
(A) an epoxy resin;
(B) a curing agent in such an amount that an equivalent ratio of the epoxy group in the component (A) to a functional group in the component (B) ranges from 0.7 to 1.2, said functional group being reactive with the epoxy group; and
(C) an inorganic filler in an amount of from 50 to 500 parts by weight per 100 parts by weight of the component (A), and the encapsulating resin composition comprises
(a) a biphenyl aralkyl epoxy resin or triphenyl epoxy resin;
(b) a biphenyl aralkyl phenolic resin or triphenyl phenolic resin in such an amount that an equivalent ratio of the epoxy group in the component (a) to the phenolic hydroxyl group in the component (b) ranges from 0.8 to 1.2; and
(c) an inorganic filler in an amount of from 500 to 1,100 parts by weight per total 100 parts by weight of the components (a) and (b), and
characterized in that
1) the cured product of the underfill composition has a glass transition temperature, Tg, which is 100° C. or higher and is the same with or differs from a Tg of a cured product of the encapsulation resin composition by 20° C. or smaller,
2) a total of a linear expansion coefficient of the cured product of the underfill composition at a temperature not higher than (Tg−30° C. and a linear expansion coefficient of the cured product of the encapsulation resin composition at a temperature not higher than (Tg−30° C. is 42 ppm/° C. or smaller, and
3) a ratio of the linear expansion coefficient of the cured product of the encapsulation resin composition to the linear expansion coefficient of the cured product of the underfill composition ranges from 0.3 to 1.0.

2. The system-in-package semiconductor device according to claim 1, wherein
the curing agent (B) is an amine curing agent or an acid anhydride curing agent.

3. The system-in-package semiconductor device according to claim 2, wherein
the curing agent (B) is at least one selected from the group consisting of the aromatic amine compounds represented by the following formulas (1), (2), (3) and (4),

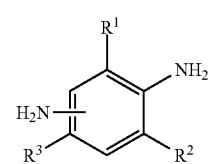

(1)

-continued

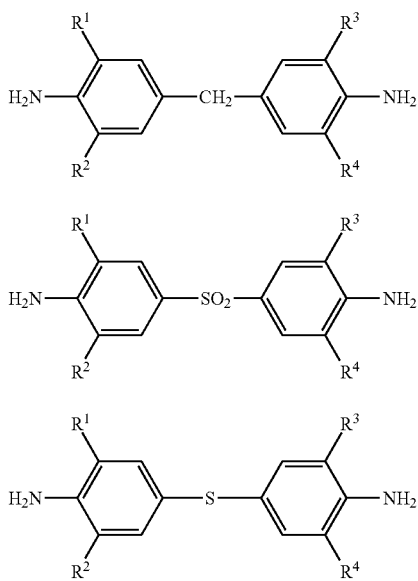

wherein $R^1$, $R^2$, $R^3$ and $R^4$ may be the same with or different from each other and are selected from the group consisting of monovalent $C_{1-6}$ hydrocarbon groups, $CH_3S$— and $C_2H_5S$—.

4. The system-in-package semiconductor device according to claim 1, wherein
the inorganic filler (C) is a spherical silica which is produced by a sol-gel method or a deflagration method and has an average particle size of from 0.1 to 5 μm.

5. The system-in-package semiconductor device according to claim 1, wherein
the component (A) is selected from the group consisting of bisphenol-A epoxy resins, bisphenol-F epoxy resins and the epoxy resins represented by the following three formulas,

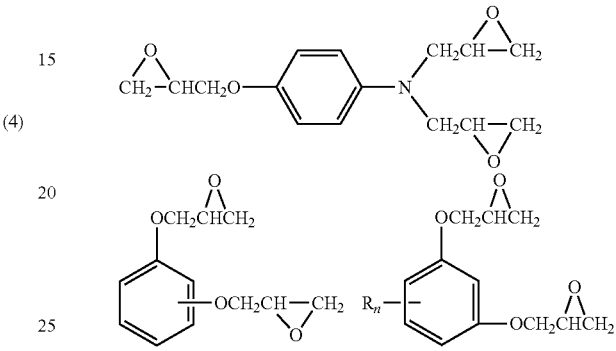

wherein R is a monovalent hydrocarbon group having 1 to 20 carbon atoms and n is an integer of from 1 to 4, and
the component (a) is a biphenyl aralkyl epoxy resin.

\* \* \* \* \*